United States Patent
Pathmanathan et al.

(10) Patent No.: US 10,249,987 B2
(45) Date of Patent: Apr. 2, 2019

(54) ELECTRONIC MODULE FOR AN I/O MODULAR SYSTEM

(71) Applicant: BUERKERT WERKE GMBH & CO. KG, Ingelfingen (DE)

(72) Inventors: Vinoth Pathmanathan, Neuenstadt (DE); Christopher Christie, Untermuenkheim (DE); Florian Fischer, Raventstein (DE); Michael Stephan, Bretzfeld (DE)

(73) Assignee: BUERKERT WERKE GMBH & CO. KG, Ingelfingen (DE)

( * ) Notice: Subject to any disclaimer, the term of this patent is extended or adjusted under 35 U.S.C. 154(b) by 0 days.

(21) Appl. No.: 15/805,433

(22) Filed: Nov. 7, 2017

(65) Prior Publication Data

US 2018/0131131 A1 May 10, 2018

(30) Foreign Application Priority Data

Nov. 8, 2016 (DE) .................. 10 2016 121 347

(51) Int. Cl.
| | |
|---|---|
| *H01R 4/50* | (2006.01) |
| *H01R 13/629* | (2006.01) |
| *H01R 13/506* | (2006.01) |
| *H01R 13/514* | (2006.01) |
| *H01R 13/717* | (2006.01) |
| *H05K 7/14* | (2006.01) |
| *H01R 9/26* | (2006.01) |

(52) U.S. Cl.
CPC ....... *H01R 13/6295* (2013.01); *H01R 13/506* (2013.01); *H01R 13/514* (2013.01); *H01R 13/7175* (2013.01); *H05K 7/1474* (2013.01); *H05K 7/1481* (2013.01); *H01R 9/2608* (2013.01)

(58) Field of Classification Search
CPC .............. H01R 13/6295; H01R 13/506; H01R 13/514; H01R 13/7175; H01R 9/2608; H01R 13/701; H05K 7/1481; H05K 7/1474; G06F 1/1632
USPC ........................................................ 439/366
See application file for complete search history.

(56) References Cited

U.S. PATENT DOCUMENTS

| | | | |
|---|---|---|---|
| 5,359,492 A | 10/1994 | Porter | |
| 5,784,253 A * | 7/1998 | Ooka | .................... G06F 1/1632 361/679.43 |
| 6,519,140 B1 * | 2/2003 | Kim | ........................ G06F 1/181 220/4.02 |
| 6,735,089 B1 | 5/2004 | Byers et al. | |
| 2013/0255430 A1 * | 10/2013 | Moriyama | ............. B62D 1/184 74/493 |
| 2014/0211423 A1 | 7/2014 | Nguyen et al. | |
| 2017/0365424 A1 * | 12/2017 | Tabata | ................. H01R 13/701 |

* cited by examiner

*Primary Examiner* — Jean F Duverne
(74) *Attorney, Agent, or Firm* — McNees Wallace & Nurick LLC

(57) ABSTRACT

An electronic module for an I/O modular system comprises a housing, a plug-in connection for the coupling to a connection of the I/O modular system, and at least one locking lever which has an actuating end arranged on the side turned away from the plug-in connection, and a locking portion. The locking lever has at least one light-conducting portion. A light source is associated with the locking lever. A light exit face is provided in the region of the actuating end of the locking lever.

18 Claims, 6 Drawing Sheets

ELECTRONIC MODULE FOR AN I/O MODULAR SYSTEM

The invention relates to an electronic module for an I/O modular system.

BACKGROUND OF THE INVENTION

I/O modular systems are known which comprise a housing, a plug-in connection for the coupling with a connection of the I/O modular system, and at least one locking lever which has an actuating end arranged on the side turned away from the plug-in connection, and a locking portion.

Such an electronic module can be used to connect various devices (servomotors, valves, sensors, computing modules, for example) to the I/O modular system. The I/O system may be a bus system for example, to which the electronic modules are coupled.

The electronic module according to the invention is in particular a so-called electronic module adapted to be lined-up, i.e. a standardized, comparatively compact electronic module from which a very large number can be mounted directly side by side on the I/O modular system.

It is known that the electronic modules detachably latch on a support or on a holder when they are attached to the I/O modular system. To this end, a locking level which for example engages a mounting rail is used.

The object of the invention is to develop the known electronic module so as to obtain an improved functionality.

BRIEF DESCRIPTION OF THE INVENTION

To achieve this object, it is provided according to the invention that the locking lever has at least one light-conducting portion, in that a light source is associated with the locking lever, and in that a light exit face is provided in the region of the actuating end of the locking lever. The basic idea of the invention consists in providing the locking lever with a lighting means such that different functions can be implemented. On the one hand, the locking lever as such can be illuminated such that it is clearly visible in a dark switch cabinet, for example, and can thus also be actuated easily. A further possibility is to use the locking lever as an indicating element such that the operating state of the electronic module can for example be indicated. In case of a malfunction, the locking lever may for example glow red or may blink such that it can immediately be recognized in a switch cabinet which electronic module is just not operating in the desired way.

The term "locking lever" designates a mobile or movable mechanical part which is adapted to transmit forces between the electronic module (more specifically the housing thereof) and the associated plug-in location. The transmitted forces permit to arrest/lock the electronic module in the plug-in location.

According to a preferred embodiment, it is provided that the light source is a LED. A LED distinguishes itself by a very high service life and simultaneously by a very low energy requirement.

According to a configuration of the invention, it is provided that the light source is located on a printed circuit board arranged within the housing. The effort for fastening the light source is in this way minimal.

The locking lever preferably has two arms which extend on either side of the printed circuit board. A compact design is thereby obtained.

According to a preferred embodiment, a coupling-in face lying opposite the light source is arranged between the arms at the actuating end. The light source may thus be arranged at the edge of the printed circuit board and can directly radiate into the coupling-in face.

Preferably, a return spring is integrated into the locking lever. This reduces the installation effort as no separate return spring has to be attached.

The return spring preferably extends starting from a central portion up to the locking portion. With such an elongated configuration of the return spring, the desired elasticity can be obtained very easily due to the material elasticity.

A bearing portion is preferably integrated into the locking lever, two bearing pins for example. They merely have to be clipped into appropriate seats in the housing such that the locking lever can be mounted with minimum effort.

The locking lever is preferably a two-armed lever in which the locking portion is arranged at an end turned away from the actuating end. In a two-armed lever, the length ratios and thus the actuating force relative to the actuating stroke can be adjusted with very little effort in the desired manner.

The locking portion is preferably configured as a locking hook such that the electronic module can reliably be latched onto the I/O modular system with little effort.

In a particularly preferred manner, the locking lever is an injection-molded part made of plastic material which can be manufactured in one piece with the desired formations (a bearing portion, the return spring and the locking hook, for example) without a subsequent mounting having to be carried out.

According to a configuration of the invention, a cover is provided which is detachably latched onto the housing. The cover may serve to cover the front side of the electronic module.

The light exit face of the locking lever is preferably visible when the cover is attached to the housing. The functionality of the locking lever is thus in any case preserved, even if the cover is used.

An opening for the actuating end of the locking lever with the light exit face thereof is preferably provided in the cover. The light exit face can be arranged directly below the opening in the cover, or the actuating end can extend through the opening of the cover such that the light exit face is located outside the cover. The light exit face is clearly visible in both cases.

The opening, as viewed in the direction of actuation of the actuating end, is preferably smaller than the actuating stroke of the actuating end. The cover, when mounted on the housing, therefore prevents the locking lever from being unintentionally actuated to such an extent that the electronic module is detached from the I/O modular system.

The cover preferably arrests the actuating end in its locking position such that it is (nearly) immobile. This increases the operational safety.

BRIEF DESCRIPTION OF THE DRAWINGS

The invention is described below with reference to one embodiment which is illustrated in the accompanying drawings which show.

DETAILED DESCRIPTION OF THE INVENTION

Figure 1:
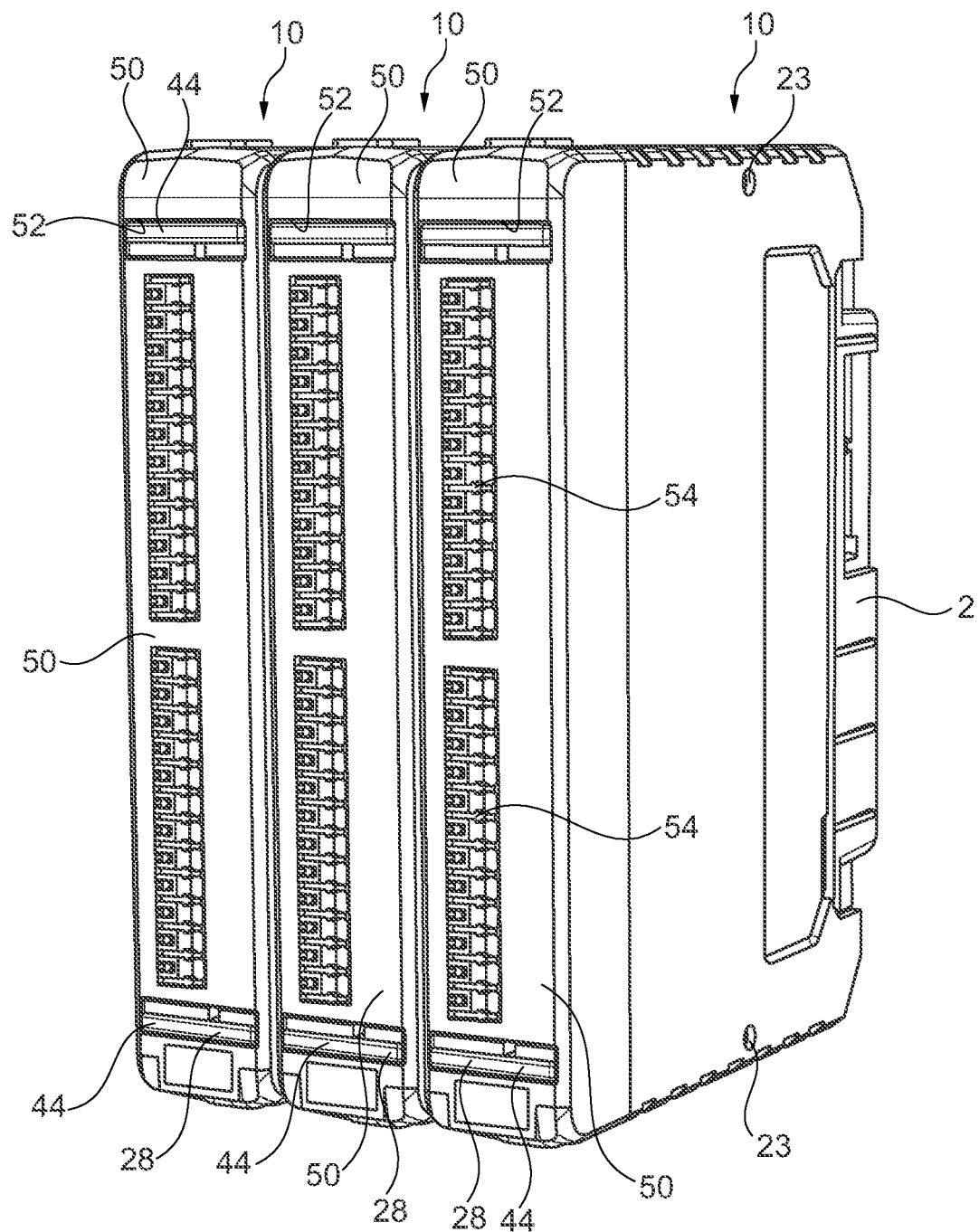
FIG. 1 a plurality of electronic modules lined-up side by side and each provided with a cover in a perspective view.

FIGS. 1 to 4 show an electronic module 10 which is intended to be used as a part of an I/O modular system. A further component of the I/O modular system is a plug-in location 2 shown in FIGS. 2 and 3 which comprises, among others, a connection in the form of a connector plug 4 and two latching edges 6.

The communication and the power supply for the electronic module 10 arranged there is integrated into the plug-in location 2.

The I/O modular system serves to receive a plurality of electronic modules 10 which are uniform with respect to their attachability and connectability to the plug-in location 2, but can execute or support different functions. Examples for such I/O modules are modules for the measurement-data acquisition, control modules for stepper motors or DC motors, for example, communication modules such as network interfaces or computing modules.

The electronic modules 10 are so-called electronic modules adapted to be lined-up as they can be arranged closely side by side in plug-in locations 2 arranged closely side by side. This is clearly visible in FIG. 1 in which three lined-up electronic modules 10 are illustrated.

Each electronic module 10 has a housing 12 in which a printed circuit board 14 is received. The printed circuit board 14 comprises different electronic components by means of which the respectively desired apparatus may be coupled to the I/O modular system.

A connector 16 which comes into engagement with the connector plug 4 when the electronic module 10 is arranged in the plug-in location 2 is provided on the side of the electronic module 10 which faces the plug-in location 2.

Figure 6:
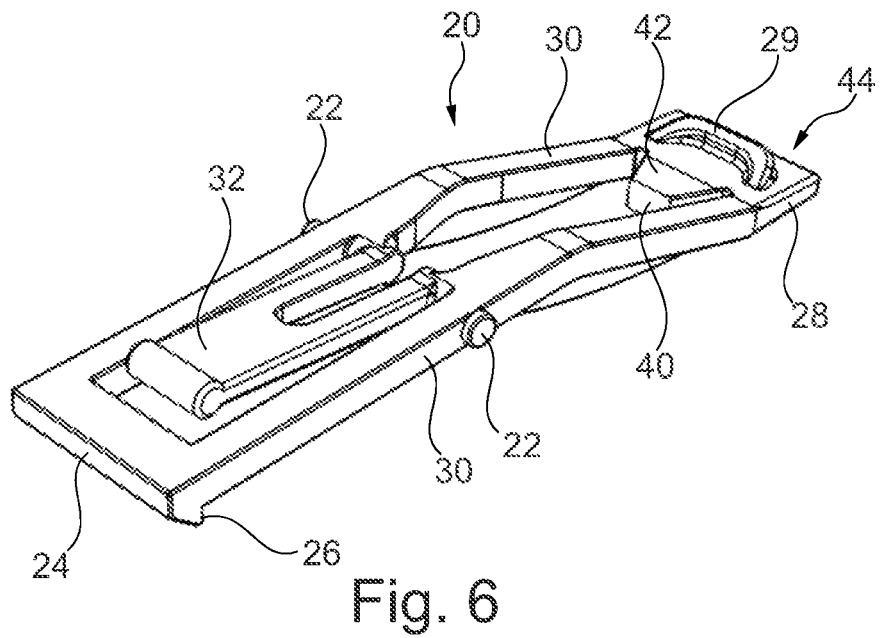
FIG. 6 the locking lever of the electronic module in a perspective view.
Figure 7:
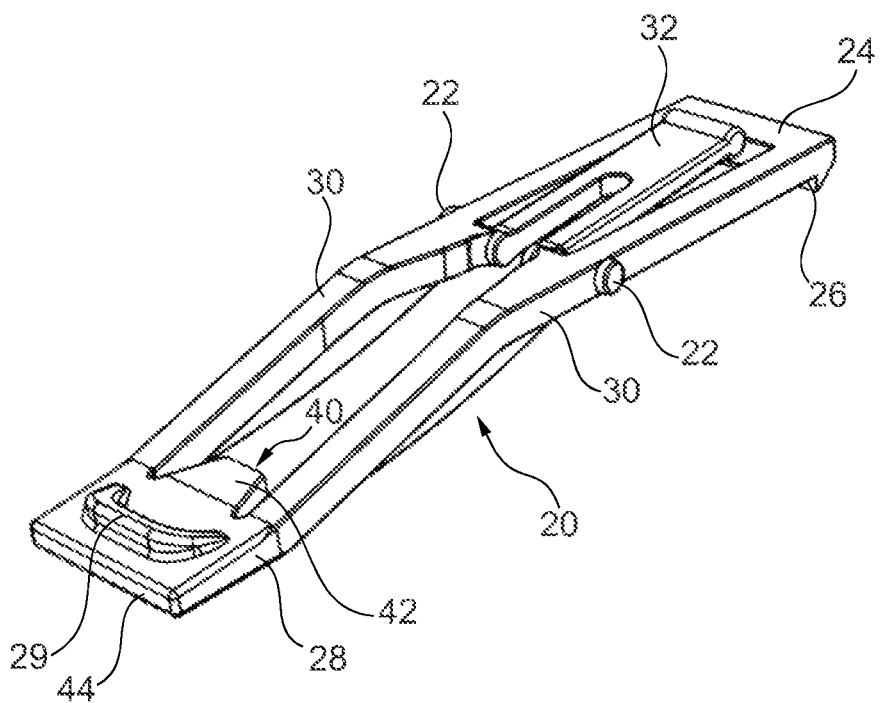
FIG. 7 the locking lever of FIG. 6 in a further perspective view.

In order to lock the electronic module 10 in the plug-in location 2, each electronic module is provided with two locking levers 20 (see also FIGS. 6 and 7). They are arranged in the region of the narrow sides of the housing 12 of each electronic module and are intended to cooperate with the latching edges 6 of the plug-in location 2.

Each locking lever 20 is here configured as a two-armed lever which has an approximately centered bearing portion 22. The bearing portion 22 is formed by two bearing pins 22 which extend starting from opposite sides of the locking lever 20 and define a bearing axis which is perpendicular to the direction of extension of the locking lever 20.

Figure 2:
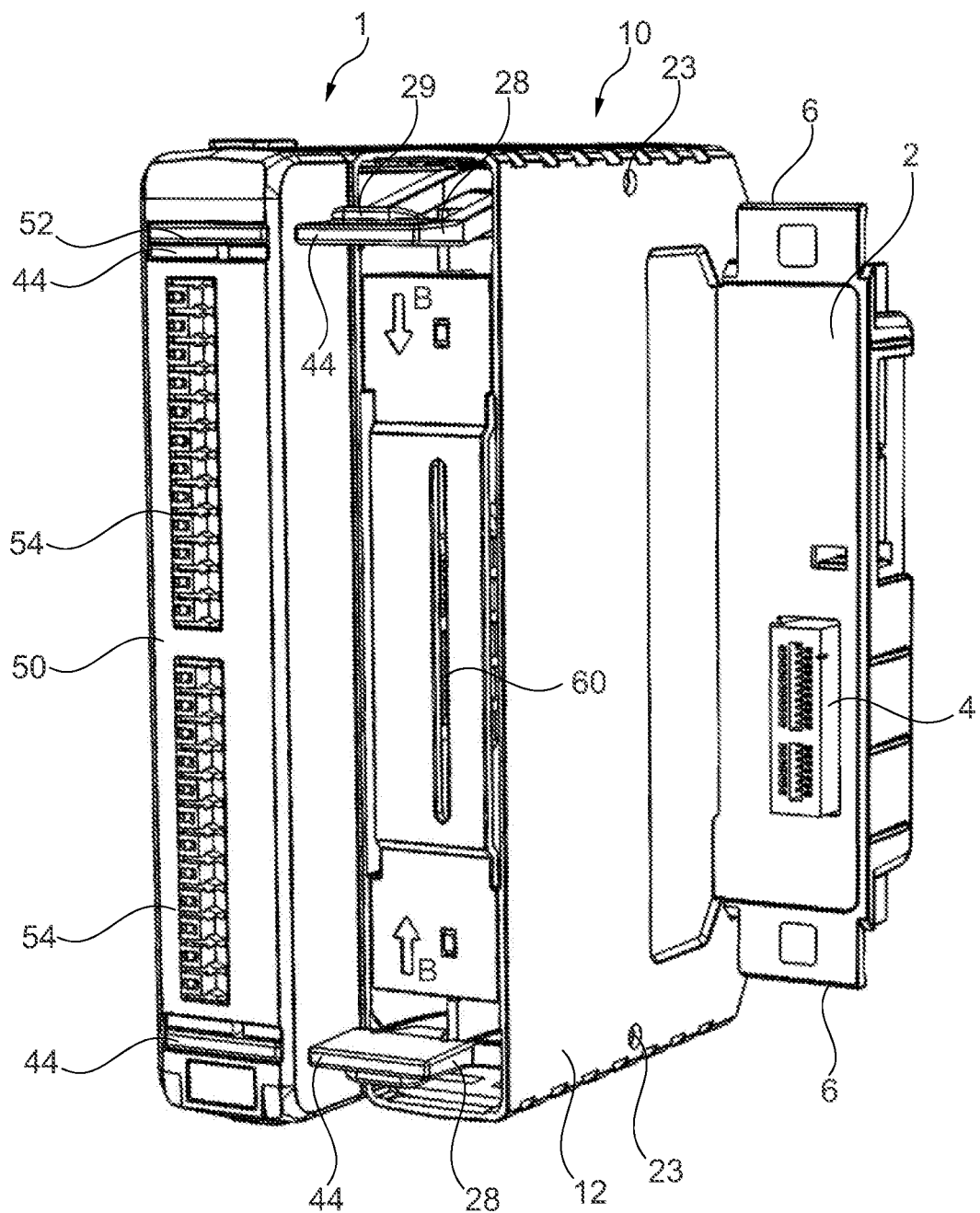
FIG. 2 two electronic modules of an I/O modular system arranged side by side in a perspective view, the cover being removed in one of the electronic modules.

The bearing pins 22 are received in openings 23 of the housing 12 (see FIG. 2).

At one end, the locking lever is configured so as to have a locking portion 24 which is provided with a locking hook 26. The locking hook 26 can cooperate with the latching edge 6 (see in particular FIG. 3).

The locking lever 20 comprises on the opposite side an actuating end 28 which is freely accessible on the front side of the housing turned away from the plug-in location 2 when the locking lever 20 is mounted in the housing 12 (see in particular FIG. 2).

A projection 29 may be provided at the actuating end 28 so as to permit a comfortable and ergonomic operation.

The actuating end 28 and the locking lever 24 are connected to each other by two arms 30 between which a free space is formed. On the side of the actuating end 28, the printed circuit board 14 extends into this free space (see overlapping in the region of the arrow P of FIG. 3).

Figure 3:
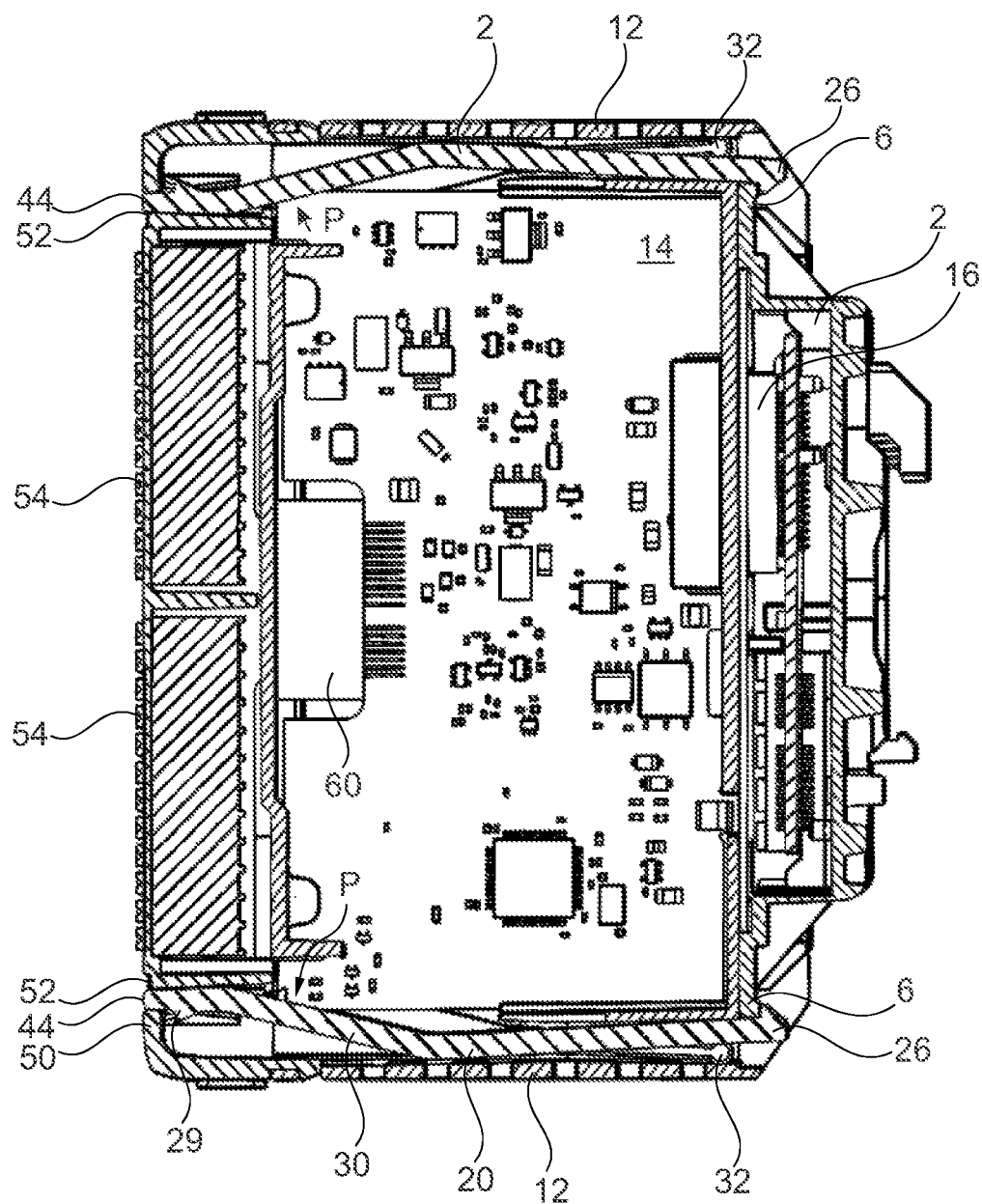
FIG. 3 an electronic module in the mounted state and with the cover mounted thereon in a sectional view.
Figure 4:
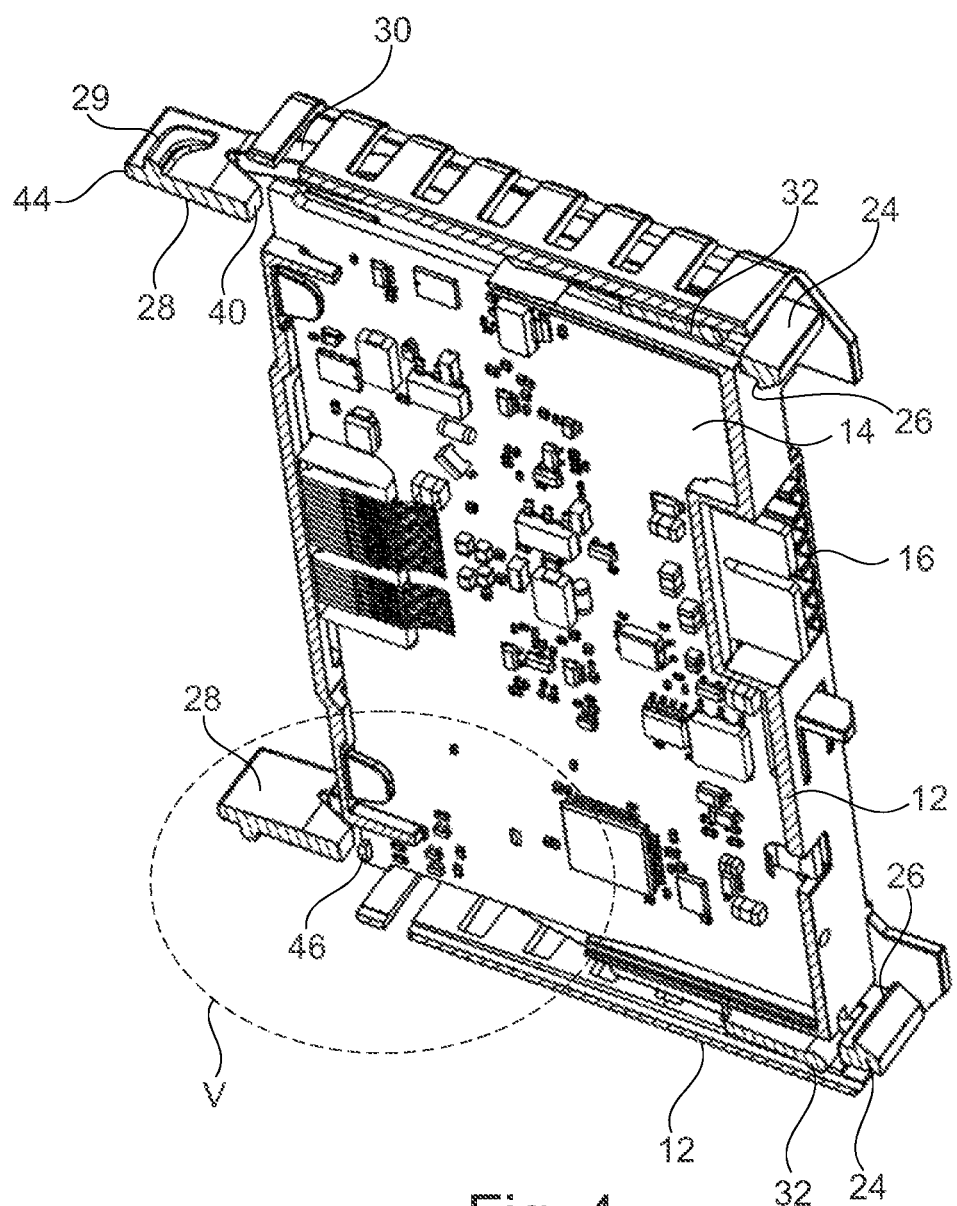
FIG. 4 the electronic module of FIG. 3 in a perspective view.

On the side of the locking portion 24, a return spring 32 is arranged within the free space, which is integrally connected with the locking lever 20 approximately at the level of the bearing portion 22 and extends from there towards the locking portion 24. As can be seen in FIGS. 3, 6, and 7, the return spring 32 extends in a plane which is slightly inclined with respect to the plane in which the locking lever 20 extends starting from the bearing portion 22 towards the locking portion 24. The free end of the return spring 32 is here located on the side of the locking lever 20 turned away from the locking hook 26.

When the electronic modules are mounted in their plug-in locations, the locking hook 26 of each locking lever 20 engages behind the appropriate latching edge 6 of the plug-in location 2 (see FIG. 3). In this position, each locking hook 26 is held by the effect of the return spring 32 which rests against the inner side of the housing 12.

In order to detach the appropriate electronic module 10 from the plug-in location 2, an operator presses the two actuating ends 28 of the two locking levers 20 of an electronic module 10 such that they come closer to one another (see also arrows B in FIG. 2). The locking hooks 26 are thus pivoted outwards away from each other such that the electronic module 10 can be removed from the plug-in location 2.

The locking levers 20 each have a coupling-in face 40 for light. It is here formed on a truncated appendix 42 which is provided between the two arms 30 on the side of the actuating end 28 which faces the locking portion 24.

On the opposite side, i.e. on the side facing outwards, the actuating end 28 is provided with a light exit face 44. The latter constitutes the end face of the locking lever 20 directed away from the plug-in location 2.

The locking lever 20 is made of a light-conducting and at least partially transparent material at least in the region of the actuating end 28 with the coupling-in face 40 and of the light exit face 44. Each locking lever 20 may also be manufactured in one piece and continuously from the same material.

Figure 5:
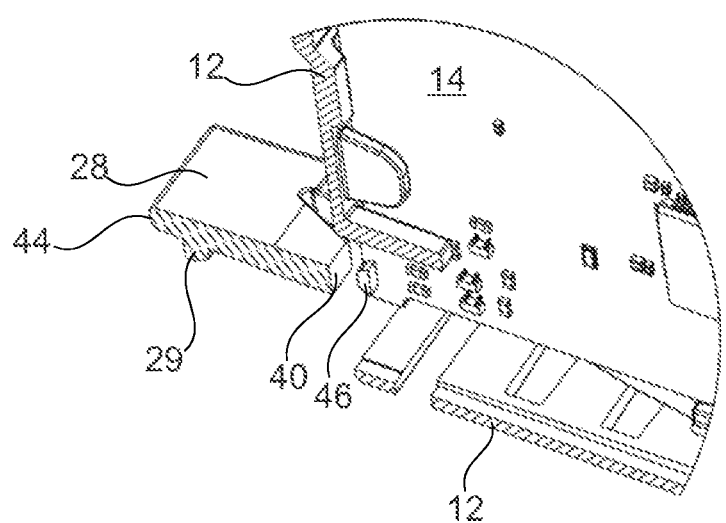
FIG. 5 the detail V of FIG. 4 in an enlarged view.

A light source 46 which is arranged at a small distance opposite the coupling-in face 40 is associated with the coupling-in face 40 of each locking lever (see in particular FIG. 5).

The light source 46 is preferably a LED mounted on the printed circuit board 14.

Using the LEDs 46, it is possible to backlight the light exit faces 44 such that the actuating ends 28 of the locking levers 20 are easily discernible during operation, for example within a dark switch cabinet.

It is also possible to associate a plurality of LEDs having different colors or multicolored LEDs with the coupling-in faces 40 such that an operating state can also be signalized via the light exit faces 44.

A proper operation can for example be signalized with green light, whereas a malfunction is signalized with red light. Other colors are for example orange which indicates that an operational check is required, or yellow by means of which it is possible to indicate that certain values are outside a specification, or that a set value cannot not be reached. It is possible to indicate with blue light that maintenance is necessary. It can be indicated with white color that the diagnosis is inactive but the apparatus carries voltage.

The colors and the meaning thereof are advantageously chosen in accordance with a NAMUR recommendation (NE) 107.

A cover 50 which may have different functions can be arranged on the side of each electronic module 10 which is turned away from the plug-in location 2 (see FIGS. 1 to 3).

The cover 50 has for each locking lever 20 an opening 52 in which here the outer end of the actuating end 28 is received. The light exit face 44 is thus arranged so as to be approximately flush with the front side of the cover 50 turned away from the electronic module 10 (see in particular FIG. 3).

As viewed in the direction of actuation B of the actuating ends 28, the opening 52 is configured with dimensions which are smaller than the stroke which is necessary to release the locking hooks 26 from the latching edges 6. In the example embodiment shown in the figures, the opening 52 is configured such that the actuating end 28 (with the exception of a certain play) is directly enclosed.

A plurality of connector plugs 54 is here fastened to the covers 50, which in turn engage into a plug socket 60 mounted on the printed circuit board 14 of the electronic module 10 via a connecting plug that is not shown in the figure. Cables forming a communication between the electronic module 10 and external devices may for example be connected to the connector plug 54.

In case it is necessary to replace an electronic module 10, it is here sufficient to merely remove the cover with the connector plugs 54. The electronic module 10 can then be replaced in that the locking levers 20 are detached via the actuating ends 28. If a new electronic module is mounted on the plug-in location 2, the cover 50 still connected with the cables is again placed thereon without having to disconnect and reconnect a plurality of cables.

The invention claimed is:

1. An electronic module for an I/O modular system, comprising a housing, a plug-in connection for the coupling to a connection of the I/O modular system, at least one locking lever which has an actuating end arranged on the side turned away from the plug-in connection, and a locking portion, the locking lever having at least one light-conducting portion, a light source being associated with the locking lever, a light exit face being provided in the region of the actuating end of the locking lever.

2. The electronic module of claim 1 wherein the light source is a LED.

3. The electronic module of claim 1 wherein the light source is arranged on a printed circuit board arranged within the housing.

4. The electronic module of claim 3 wherein the locking lever has at least one arm which extends on one of the sides of the printed circuit board.

5. The electronic module of claim 4 wherein the locking lever has two arms which extend on either side of the printed circuit board (134).

6. The electronic module of claim 5 wherein a coupling-in face lying opposite the light source is arranged at the actuating end between the arms.

7. The electronic module of claim 1 wherein a return spring is integrated into the locking lever.

8. The electronic module of claim 7 wherein the return spring extends starting from a central portion towards the locking portion.

9. The electronic module of claim 1 wherein a bearing portion is integrated into the locking lever.

10. The electronic module of claim 1 wherein the locking lever is a two-armed lever in which the locking portion is arranged at an end turned away from the actuating end.

11. The electronic module of claim 1 wherein the locking portion has a locking hook.

12. The electronic module of claim 1 wherein the locking lever is an injection-molded part made of plastic material.

13. The electronic module of claim 1 wherein a cover is provided which is detachably latched on the housing.

14. The electronic module of claim 13 wherein the light exit face of the locking lever is visible when the cover is attached to the housing.

15. The electronic module of claim 13 wherein an opening for the actuating end of the locking lever with its light exit face is provided in the cover.

16. The electronic module of claim 15 wherein the opening, as viewed in the direction of actuation of the actuating end, has a dimension which is smaller than a actuating stroke of the actuating end.

17. The electronic module of claim 13 wherein the cover arrests the actuating end in a locking position.

18. An electronic module for an I/O modular system, comprising a housing, a plug-in connection for the coupling to a connection of the I/O modular system, at least one locking lever which has an actuating end arranged on the side turned away from the plug-in connection, and a locking portion, the locking lever having at least one light-conducting portion, the locking lever having a coupling-in face for light and on the opposite side, the actuating end is provided with a light exit face, a light source being associated with the locking lever, a light exit face being provided in the region of the actuating end of the locking lever.

* * * * *

UNITED STATES PATENT AND TRADEMARK OFFICE
CERTIFICATE OF CORRECTION

PATENT NO. : 10,249,987 B2
APPLICATION NO. : 15/805433
DATED : April 2, 2019
INVENTOR(S) : Pathmanathan et al.

Page 1 of 1

It is certified that error appears in the above-identified patent and that said Letters Patent is hereby corrected as shown below:

On the Title Page

On the fourth line of the Inventors (item (72)) "Raventstein" should be --Ravenstein--

Signed and Sealed this
Twenty-third Day of July, 2019

Andrei Iancu
*Director of the United States Patent and Trademark Office*